United States Patent
Chang et al.

(10) Patent No.: US 8,512,858 B2
(45) Date of Patent: Aug. 20, 2013

(54) HOUSING AND MANUFACTURING METHOD THEREOF

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Zhi-Jie Hu, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

(*) Notice: Subject to any disclaimer, the term of this patent is extended or adjusted under 35 U.S.C. 154(b) by 205 days.

(21) Appl. No.: 13/010,942

(22) Filed: Jan. 21, 2011

(65) Prior Publication Data
US 2012/0077024 A1    Mar. 29, 2012

(51) Int. Cl.
*B32B 3/00* (2006.01)
*B32B 15/04* (2006.01)
*C23F 1/00* (2006.01)
*B05D 3/10* (2006.01)
*B05D 1/36* (2006.01)

(52) U.S. Cl.
USPC .......... 428/336; 428/472; 428/332; 428/632; 428/627; 428/698

(58) Field of Classification Search
None
See application file for complete search history.

(56) References Cited

U.S. PATENT DOCUMENTS

| | | | | |
|---|---|---|---|---|
| 5,714,274 | A * | 2/1998 | Sugiura et al. | 428/690 |
| 6,579,423 | B2 * | 6/2003 | Anzaki et al. | 204/192.15 |
| 2002/0086164 | A1 * | 7/2002 | Anzaki et al. | 428/432 |
| 2002/0130616 | A1 * | 9/2002 | Shirakawa et al. | 313/509 |
| 2003/0072975 | A1 * | 4/2003 | Shero et al. | 428/704 |
| 2009/0071371 | A1 * | 3/2009 | Theodore et al. | 106/287.11 |
| 2012/0164438 | A1 * | 6/2012 | Chang et al. | 428/336 |
| 2012/0171502 | A1 * | 7/2012 | Chang et al. | 428/469 |

\* cited by examiner

*Primary Examiner* — Vera Katz
(74) *Attorney, Agent, or Firm* — Altis Law Group, Inc.

(57) ABSTRACT

A housing includes a substrate and a nano-composite layer deposited on the substrate. The nano-composite layer includes a number of metal oxide nitride layers and a number of Ce layers. Each metal oxide nitride layer alternates with a Ce layer, and the outermost nano-composite layer is a metal oxide nitride layer. The metal in the metal oxide nitride layer aluminum, titanium, silicon, chromium, or zirconium.

10 Claims, 2 Drawing Sheets

HOUSING AND MANUFACTURING METHOD THEREOF

BACKGROUND

1. Technical Field

The disclosure relates to portable devices, and particularly to a device housing and method for manufacturing the housing.

2. Description of Related Art

With the development of wireless communication and information processing technology, portable electronic devices such as mobile telephones and electronic notebooks are now in widespread use. Aluminum alloy and magnesium alloy have good heat dissipation and can effectively shield electromagnetic interference, and have thus been widely used for housings of the portable electronic devices. However, aluminum alloy and magnesium alloys have low corrosion resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary housing and method for manufacturing the housing. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
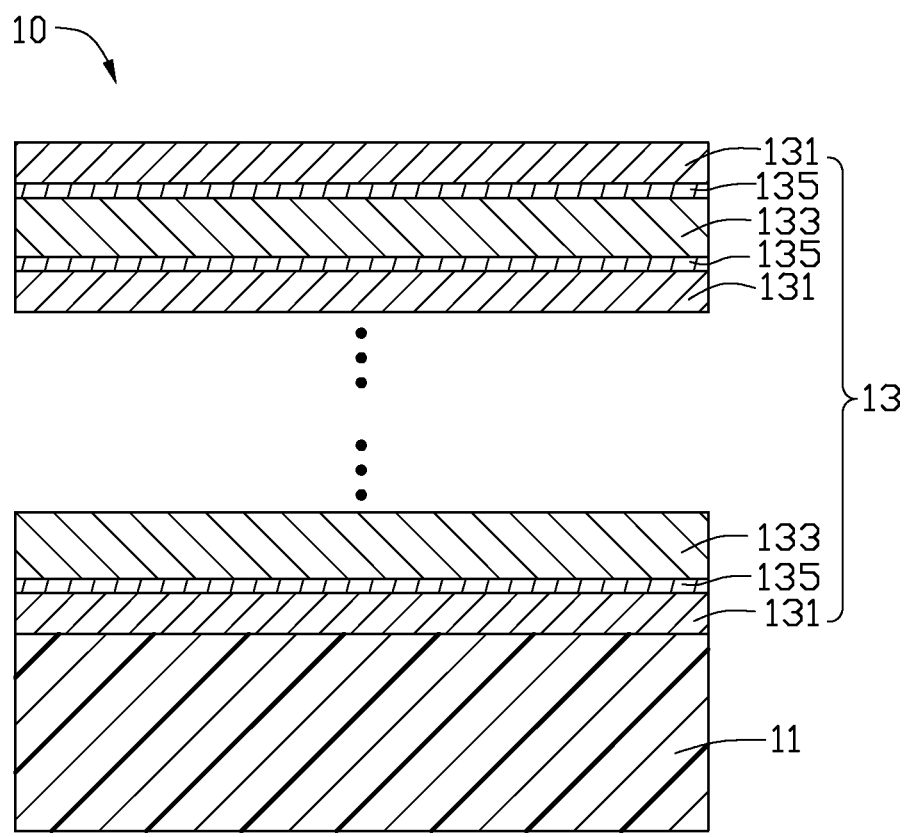
FIG. 1 is a cross-section of an exemplary embodiment of a housing.

Referring to FIG. 1, an exemplary embodiment of a housing 10 includes a substrate 11 and a nano-composite layer 13 deposited on the substrate 11. The substrate 11 is metallic material, such as aluminum, aluminum alloy, magnesium or magnesium alloy. The housing 10 may be a housing for electronic devices. The nano-composite layer 13 includes a number of metal oxide nitride (MON) layers 131 alternating with a number of cerium (Ce) layers 133. The outermost layer of the nano-composite layer 13 is a MON layer 131, and the nano-composite layer 13 bonds/contacts with the substrate 11 by a MON layer 131 or a Ce layer 133. The MON layers 131 and the Ce layers 133 may be deposited by magnetron sputtering. The nano-composite layer 13 has a thickness ranging from about 1 μm to about 3 μm.

In this exemplary embodiment, the number of MON layers 131 and the number of Ce layers 133 may be each about 6~30. The metal in the MON layer 131 may be aluminum, titanium, silicon, chromium or zirconium, and preferably aluminum. The atomic nitrogen content and the atomic oxygen content in each MON layer 131 may be the same, or each gradually increases from near the substrate 11 to away from the substrate 11.

Figure 2:
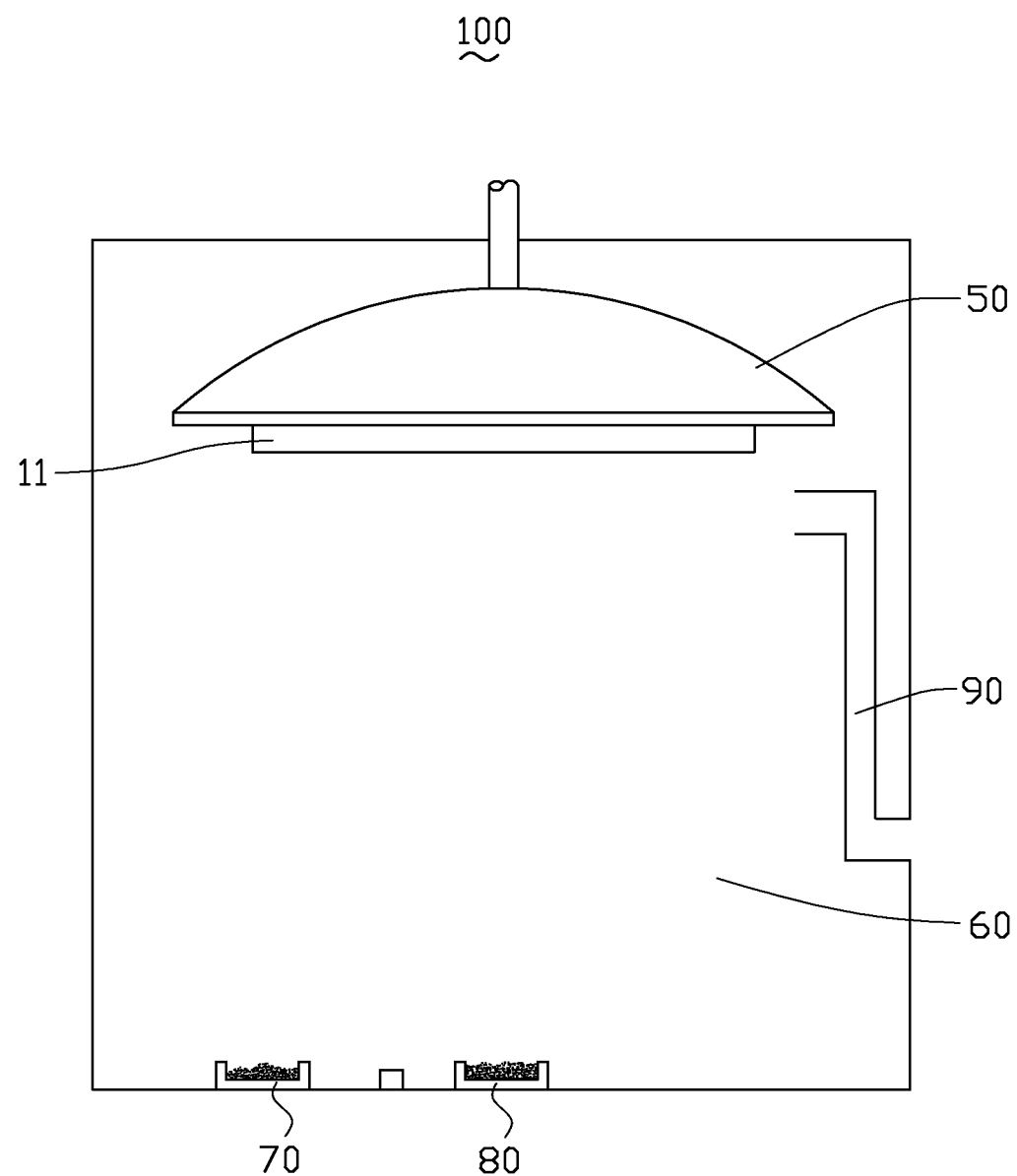
FIG. 2 is a schematic view of a magnetron sputtering coating machine for manufacturing the housing of FIG. 1.

Referring to FIG. 2, a method for manufacturing the housing 10 may include at least the following steps.

A substrate 11 is provided. The substrate 11 may be made of aluminum, aluminum alloy, magnesium or magnesium alloy.

The substrate 11 is pretreated by washing with a solution such as alcohol or acetone in an ultrasonic cleaner, to remove grease, dirt, and other impurities. The substrate 11 is dried and cleaned by argon plasma cleaning. The substrate 11 is retained on a rotating bracket 50 in a vacuum chamber 60 of a magnetron sputtering coating machine 100 with vacuum level at $8.0 \times 10{-3}$ Pa. Pure argon is fed into the vacuum chamber 60 at about 10 Standard Cubic Centimeters per Minute 0 (sccm) to 500 sccm from a gas inlet 90, and a bias voltage is applied to the substrate 11 in a range from −500 to −800V for about 3-10 minutes. The substrate 11 is washed by argon plasma, to further remove grease or dirt. Thus, the binding force between the substrate 11 and the nano-composite layer 13 is enhanced.

A nano-composite layer 31 is deposited on the substrate 11 as follows. a MON layer 131 and a Ce layer 133 are deposited on the substrate 11 alternatively until 6 to 30 MON layers 131 and 6 to 30 Ce layers 133 are deposited, providing a nano-composite layer 13.

In a first exemplary embodiment of a method of depositing a MON layer 131 on a substrate 11, temperature of the vacuum chamber 60 is adjusted to about 50° C. to 300° C. Pure argon is fed into the vacuum chamber 60 at a flux of about 100 sccm to 300 sccm from the gas inlet 90. Oxygen is fed into the vacuum chamber 60 at a flux from about 40 sccm to about 80 sccm and nitrogen is fed into the vacuum chamber 60 at a flux from about 40 sccm to about 80 sccm from the gas inlet 90. The substrate 11 is rotated in a range from 1 revolution per minute (rpm) to 4 rpm. A metal target such as aluminum, titanium, silicon, chromium, or zirconium 70, in vacuum chamber 60 is evaporated using a power from 7 kw to 11 kw for a time from about 5 min to about 15 min, to deposit a MON layer 131 on the substrate 11.

A second exemplary embodiment of depositing a MON layer 131 on the substrate 11 is as follows: the temperature of the vacuum chamber 60 is adjusted to about 50° C. (Celsius degree) to 300° C. Pure argon is fed into the vacuum chamber 60 at a flux of about 100 sccm to 300 sccm from the gas inlet 90. Oxygen is fed into the vacuum chamber 60 at a flux from about 10 sccm to about 20 sccm and nitrogen is fed into the vacuum chamber 60 at a flux from about 10 sccm to about 20 sccm from the gas inlet 90, and the flux of the nitrogen and the flux of the oxygen are each increased about 5 sccm to about 15 sccm every 15 minute. The substrate 11 is rotated in a range from 1 revolution per minute (rpm) to 4 rpm. The metal target such as aluminum target, titanium target, silicon target, chromium target or zirconium target) 70, in vacuum chamber 60 is evaporated using a power from 7 kw to 11 kw for a time from about 5 min to about 15 min, to deposit a MON layer 131 on the substrate 11.

During the second step, the temperature of the vacuum chamber 60 is adjusted to about 50° C. to 300° C. Pure argon is fed into the vacuum chamber 60 at a flux of about 100 sccm to 300 sccm from the gas inlet 90 with oxygen and nitrogen stopped feeding into the vacuum chamber 60. A cerium target 80 in vacuum chamber 60 is evaporated using a power from 7 kw to 11 kw for a time from about 5 min to about 15 min, to deposit a Ce layer 133 on the MON layer 131.

During deposition of the MON layer 131, the metal reacts with oxygen and nitrogen to form a metal-oxygen phase and metal-nitrogen phase. The metal-oxygen phase and metal-nitrogen phase can prevent metal-oxygen crystals and metal-nitrogen crystals from enlarging, to improve corrosion resistance of the housing 10. Additionally, a cerium-oxide layer 135 is formed between each MON layer 13 and nearest Ce layer 12, which can prevent corrosion liquid or corrosion gas from diffusing into the inner nano-composite layer 13. Corrosion resistance is enhanced by the cerium oxide layer 135.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A housing, comprising:
    a substrate; and
    a nano-composite layer deposited on the substrate, the nano-composite layer comprising a number of metal oxide nitride layers and an equal number of Ce layers, and each metal oxide nitride layer alternating with a Ce layer, wherein the Ce layer consists of Ce, the outermost layer of the nano-composite layer being a metal oxide nitride layer;
    wherein metal in the metal oxide nitride layer is a selected from a group consisting of aluminum, titanium, chromium and zirconium.

2. The housing as claimed in claim 1, wherein the substrate is made of metallic element.

3. The housing as claimed in claim 2, wherein the metallic element is selected from an aluminum, aluminum alloy, magnesium and magnesium alloy.

4. The housing as claimed in claim 1, wherein the layer of the nano-composite layer contacting with the substrate is a Ce layer.

5. The housing as claimed in claim 1, wherein the metal oxide nitride layers and the Ce layers are deposited by magnetron sputtering.

6. The housing as claimed in claim 1, wherein the nano-composite layer has a thickness ranging from about 1 μm to about 3 μms.

7. The housing as claimed in claim 1, wherein the number of metal oxide nitride layers and the number of Ce layers is each about 6~30.

8. The housing as claimed in claim 1, wherein an atomic nitrogen content and an atomic oxygen content in each metal oxide nitride layers is the same.

9. The housing as claimed in claim 1, wherein an atomic nitrogen content and an atomic oxygen content in metal oxide nitride layers are each gradually increased from near the substrate to away from the substrate.

10. The housing as claimed in claim 1, wherein a cerium-oxide layer is formed between each metal oxide nitride layer and nearest Ce layer.

\* \* \* \* \*